(12) United States Patent
Chapple-Sokol et al.

(10) Patent No.: US 6,426,558 B1
(45) Date of Patent: Jul. 30, 2002

(54) METALLURGY FOR SEMICONDUCTOR DEVICES

(75) Inventors: Jonathan Chapple-Sokol, Essex Junction, VT (US); Paul M. Feeney, Aurora, IL (US); Robert M. Geffken, Burlington, VT (US); David V. Horak, Essex Junction, VT (US); Mark P. Murray, Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/854,890

(22) Filed: May 14, 2001

(51) Int. Cl.$^7$ ................................................ H01L 23/48
(52) U.S. Cl. ...................................... 257/758; 257/759
(58) Field of Search ............................... 257/758, 759, 257/301; 438/636, 3, 638

(56) References Cited

U.S. PATENT DOCUMENTS

| | | | |
|---|---|---|---|
| 5,539,255 A | 7/1996 | Cronin | 257/750 |
| 5,691,238 A | 11/1997 | Avanzino et al. | 437/195 |
| 5,760,475 A | 6/1998 | Cronin et al. | 257/758 |
| 5,874,778 A * | 2/1999 | Bhattacharyya et al. | 257/758 |
| 6,130,102 A * | 10/2000 | White, Jr. et al. | 438/3 |
| 6,133,144 A * | 10/2000 | Tsai et al. | 438/634 |
| 6,150,721 A * | 11/2000 | Bandyopadhyay | 257/758 |
| 6,174,803 B1 * | 11/2001 | Harvey | 438/638 |
| 6,316,801 B1 * | 11/2001 | Amanuma | 257/306 |

* cited by examiner

Primary Examiner—Hoai V. Ho
Assistant Examiner—Thinh Nguyen
(74) Attorney, Agent, or Firm—Howard J. Walter, Jr.

(57) ABSTRACT

A method and structure is described which improves the manufacturability of integrated circuit interconnect and stud contacts in contact with semiconductor substrates and upper levels of metallization. The monolithic structure is formed from a thick layer of refractory metal. A variation in the monolithic structure is in the use of a dual damascene local interconnect portion of the structure which allows the local interconnect to pass over structures previously formed on the substrate.

8 Claims, 7 Drawing Sheets

METALLURGY FOR SEMICONDUCTOR DEVICES

BACKGROUND OF THE INVENTION

This invention relates to the manufacture of semiconductor devices and particularly to the manufacture of metallurgy for integrated circuit devices.

DESCRIPTION OF THE PRIOR ART

The manufacture of semiconductor devices requires the successful completion of several hundred discrete manufacturing steps. Although the yield for each step may be high, the cumulative yield many times is quite low. Thus, each process step becomes a critical factor in the, overall yield and ultimate cost of the semiconductor device being manufactured

BRIEF SUMMARY OF THE INVENTION

This invention relates to the formation of metallurgical interconnects for semiconductor devices and specifically is directed to the formation of contacts formed at the semiconductor surface which interface with metallurgy formed of copper-based metals. While copper has begun to displace the use of aluminum-based materials as metallurgical interconnects in semiconductor devices, copper cannot merely be substituted for aluminum. Because copper cannot be used in direct contact with a semiconductor substrate, it is necessary to provide a barrier conductor between copper and the remainder of the copper metallurgy. Typically this barrier conductor is the same refractory metal interconnect used previously with aluminum-based metallurgy, as described in more detail in U.S. Pat. No. 5,760,475. Such contacts are typically formed by a Physical Vapor Deposition (PVD) process of a layer of a refractory metal liner into a via formed in a dielectric layer, followed by a Chemical Vapor Deposition (CVD) process filling the remainder of the via with, for example, tungsten.

Because CVD processes form conformal deposited layers, via holes tend to fill in such a manner that a "seam" forms in the center of the via. These seams do not create a process yield problem when PVD aluminum metallurgy is subsequently deposited and subtractively etched. The change to copper-based metallurgy, however, has proved to be troublesome in a number of ways. Copper is preferably and most efficiently deposited by the use of an electrolytic process. We have discovered that the presence of "seams" in vias can be the source of copper plated defects which have been found to cause yield loss in semiconductor product wafers. The present invention reduces plated copper defects in the first wiring level (M1) caused by metal fill problem at the local interconnect (MC) level in the local interconnect(MC)/stud contact (CA)/first wiring level (M1) process sequence used in tungsten stud interconnect technology.

The currently practiced process sequence of stud interconnect technology is as follows:

1. Local interconnect trenches are etched into a first insulating layer deposited on top of a substrate having active devices therein.

2. The etched trenches are filled with a liner/tungsten core to make contact with some portions of the substrate devices and polished to be coplanar with the first insulating layer to form the local interconnect (MC).

3. A second insulating layer is deposited and stud contact holes etched into it.

4. The etched stud contact holes are filled with a liner/tungsten core and polished to be coplanar with the second insulating layer forming the stud contacts (CA) imbedded in the insulating layer which make contact with the local interconnect (MC) and also with additional portions of the devices, e.g. CMOS device gate electrodes.

5. The first wiring level (M1) is then formed by either a deposition and subtractive etch or by a damascene process (requiring a third insulating layer). This M1 wiring level makes contact with the stud contacts (CA).

A drawback to this processes sequence is the difficulty of completely filling long trenches with tungsten, as this leads to the formation of voids in the formn of open seams in the local interconnect layer. These seams lead to similar problems in the stud contact tungsten. The seam problem is made worse by cleaning steps between the local interconnect (MC) and stud contact (CA) levels. The voids propagated into the stud contact (CA) cause plating problems when copper wiring is used at the first wiring (M1).

Basically, copper plating solution works its way down into the local interconnect/stud contact (CA/MC) voids and is trapped; during subsequent high temperature process steps, about 400 degrees C., the first wiring layer (M1) is disrupted when the trapped plating solution explodes.

This invention eliminates the problem by forming the local interconnect (MC) and stud contact (CA) as a monolithic structure. The present invention reduces the extent of the stud contact (CA) voiding by eliminating the need for the clean between local interconnect (MC) and stud contact (CA) that increases the size of the local interconnect (MC) seam. The invention accomplishes this by forming the local interconnect (MC) and stud contact (CA) monolithically. The lower portion of the combined local interconnect/stud contact (MC/CA) interconnect performs the same function as the local interconnect (MC) level, and the upper portion of the combined local interconnect/stud contact (MC/CA) interconnect performs the function of stud contact (CA).

It is an object of the invention to provide enhanced reliability and product yield by simplifying the process sequence.

It is another object to enhance the metallurgical interconnect technology for copper-based semiconductor wiring.

These and other objects will become more apparent to those skilled in the art in view of the further description of the preferred embodiments of the invention and the accompanying drawings.

DETAILED DESCRIPTION OF THE INVENTION

Figure 1:
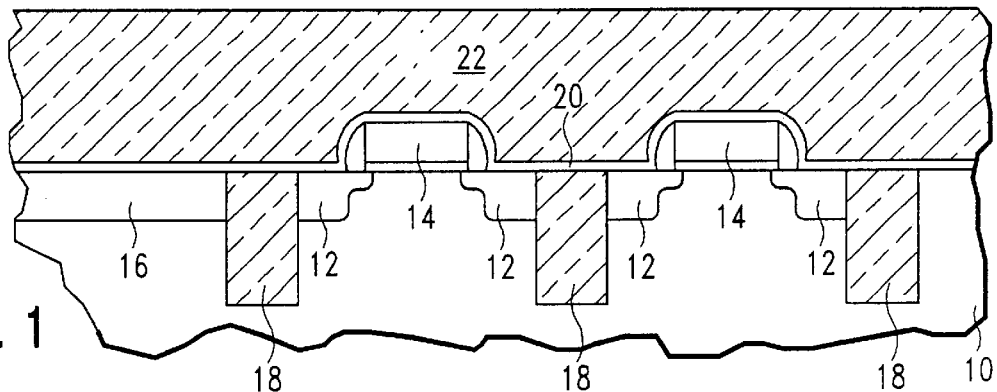
FIGS. 1 through 6B are cross-sectional views of a semiconductor device viewed at a number of times during a processing sequence utilizing the invention.

Referring now to FIGS. 1 through 6, there is shown a typical CMOS semiconductor device in cross-section. In FIG. 1 a semiconductor substrate 10 having FET or other semiconductor devices such as Charge-Coupled Devices (CCD), bipolar or other semiconductor. The FET devices having source/drain diffusions 12 and gate electrodes 14 are formed on the surface of substrate 10. The semiconductor devices are isolated from each other and other surface diffusions 16 by isolation regions 18, here shown as shallow trench isolation (STI). Over the active devices, a conformal layer 20 of, for example, silicon nitride is deposited. This is followed by a planarized insulator layer 22. Insulator 22 may be deposited borophosphosilicate glass (BPSG), phosphosilicate glass (PSG), a silicon oxide or an organic low-k dielectric material. These structures form the basis of semiconductor technologies to which the invention pertains and need not be specifically referred to further. In order to accommodate the combined local interconnect/stud contact of the invention, the thickness of insulator 22 is required to be increased.

Figure 2:
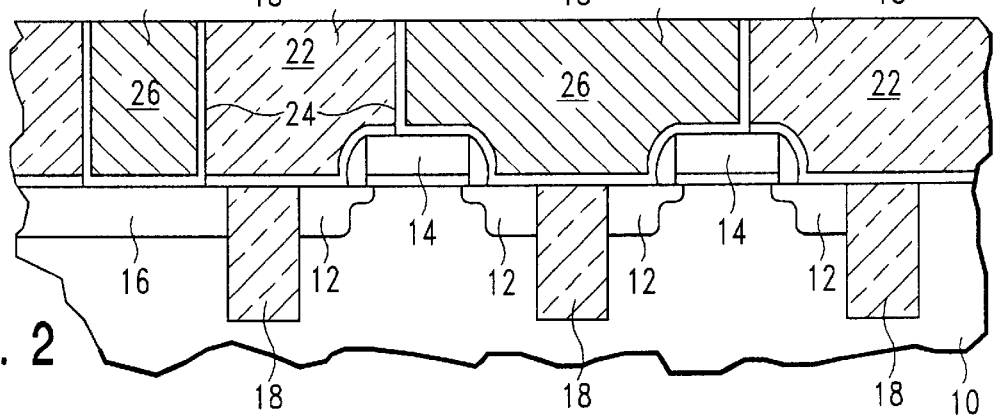

As illustrated in FIG. 2, a photo masking operation is used to define the location of each substrate contact and local interconnect within insulator 22. This is followed by the operations of etching the insulator 22 and the nitride layer 20 by a standard selective anisotropic dry etch, such as a perfluorocarbon-based Reactive Ion Etch (RIE). Next, the etched openings are filled by depositing a liner/adhesive layer 24 of, for example, titanium nitride, followed by depositing a compatible conductive fill material 26 of, for example, tungsten. As commonly practiced, the composite layers are planarized preferably by a now standard chemical mechanical planarization (CMP) process.

Because the local interconnect and stud contacts are formed in a single process, any problems related to the treatment of substrates between multiple process steps has been eliminated.

While titanium nitride/tungsten is the preferred embodiment for the local interconnect/stud contact, other materials such as aluminum, titanium or polysilicon can be used as the conductive fill.

Figure 3:
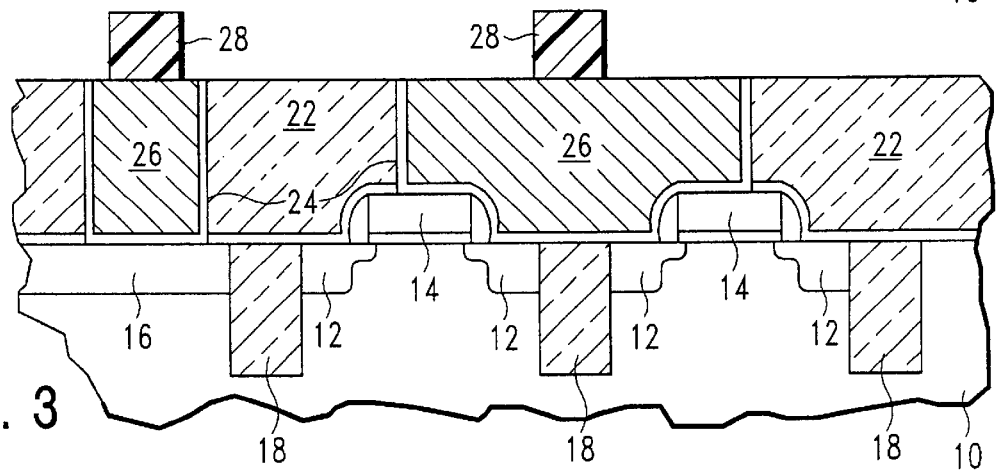

Next, the formation of the actual stud contact is formed by way of a photolithographic masking and etch back step. In FIG. 3 a photo mask 28 is formed on top of the tungsten areas where the upper portion of the interconnect is to be formed. The mask used is the complement of that used in the normal manufacturing process. The may be a simple erodible photoresist or a thin etch resistant hardmask capable of withstanding the following etching step, such as silicon nitride or silicon dioxide.

Figure 4:
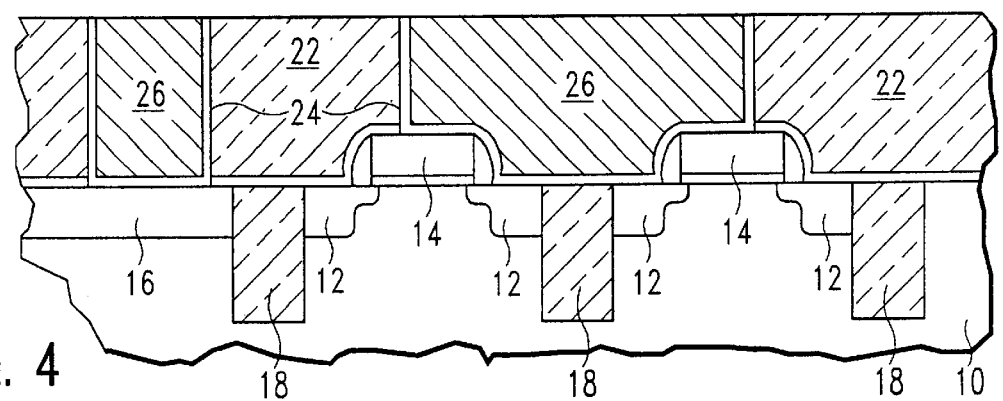

In FIG. 4 The exposed tungsten/liner/insulator (26-24-22) has been anisotropically etched back leaving pillars 30 of tungsten which constitute the "stud contact (CA)" portion of the combined local interconnect/stud contact (MC/CA) interconnect. The etch process step may be accomplished by a RIE process using argon and nitrogen trifluoride under high DC bias conditions or sulfur hexafluoride under high DC bias conditions followed by an optional cleaning step using, for example, a dilute mixture of sulfuric acid and hydrogen peroxide or a mixture of chromic-phosphoric acid can be used to clean RIE residuals. RIE chemistry and conditions for polysilicon, aluminum, and titanium are standard HCl-BCl3-based processes.

At this point several alternative process sequences can be taken. The processing can continue with a standard aluminum-based subtractively etched technology or with a more aggressive damascene copper technology.

Figure 5A:
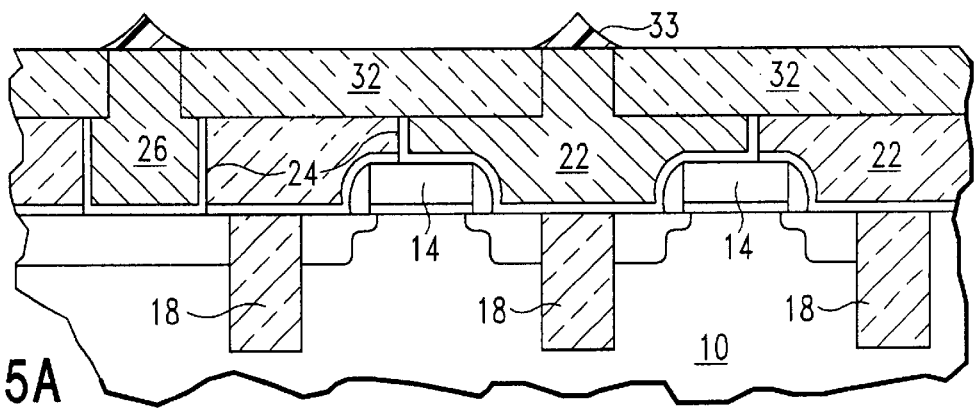
Figure 6A:
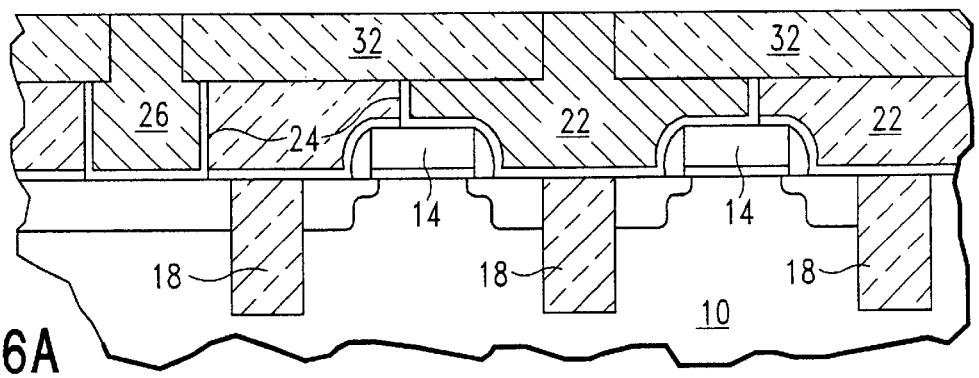

FIGS. 5A and 6A illustrate the aluminum-based technology approach. First, an insulator layer 32, comprising preferably a high density plasma chemical vapor deposition (HDPCVD) silicon oxide layer is deposited to a thickness of about equal to the height of the stud contacts 30. This step leaves cusps or peaks 33 on top of the studs 30. Deposition of the insulator is followed by a CMP process to flatten and coplanarize the insulator/stud surface as shown in FIG. 6A. This alternative is the most useful for subtractively etched metallization processes such as aluminum-based metal wiring.

The insulator layer 32 may alternatively be a standard PECVD, a spin on glass (SOG). In the process sequence defined by FIGS. 5A and 6A the SOG would be spun on to a depth slightly less than the height of the upper portion of the combined local interconnect/stud contact (MC/CA) interconnect. In the process sequence defined by FIGS. 5B and 6B it would be spun on to a depth significantly greater than the height of the upper portion of the combined local interconnect/stud contact (MC/CA) interconnect. In both cases the cusp or "teepee" over the upper portion of the combined local interconnect/stud contact (MC/CA) interconnect would be removed by a planarization process.

Those skilled in the art will appreciate the fact that various low-k materials may be substituted for insulator layers 22 and 32.

Figure 5B:
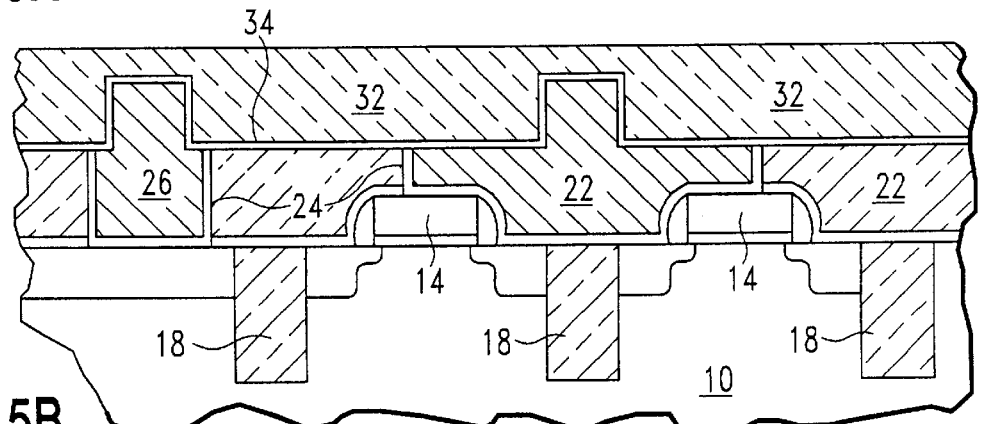

In FIG. 5B a HDPCVD silicon oxide has been deposited and planarized. Note the thickness is greater than in FIG. 5A and an optional silicon nitride layer has first been deposited under the HDPCVD silicon oxide. This alternative would be most useful for damascene aluminum metal wiring (preferably, no silicon nitride layer) or damascene copper metal wiring (silicon nitride layer preferred).

Figure 6B:
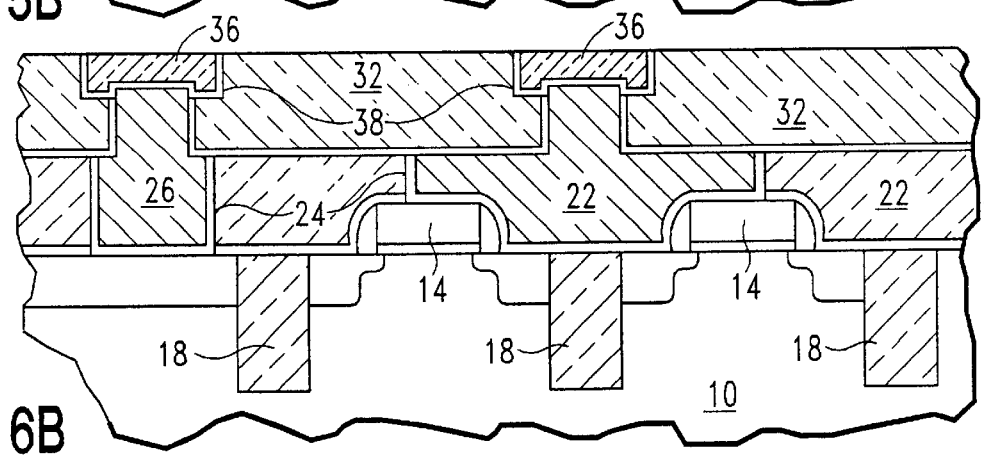

Referring to FIG. 6B, there is shown the resulting structure when copper layer 36 and its required barrier layer 38 are formed and coplanarized with insulator 32 using a damascene process, as known in the art. Alternatively, any damascene metallurgy process can be used.

Figure 7:
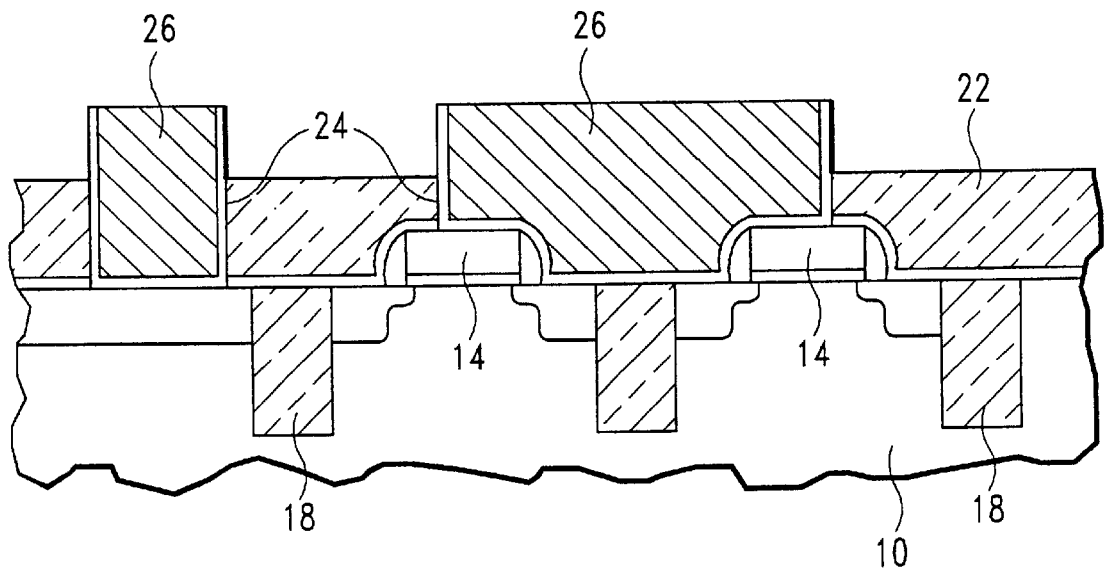
FIGS. 7 and 8 are cross-sectional views of a second embodiment of the invention.
Figure 8:
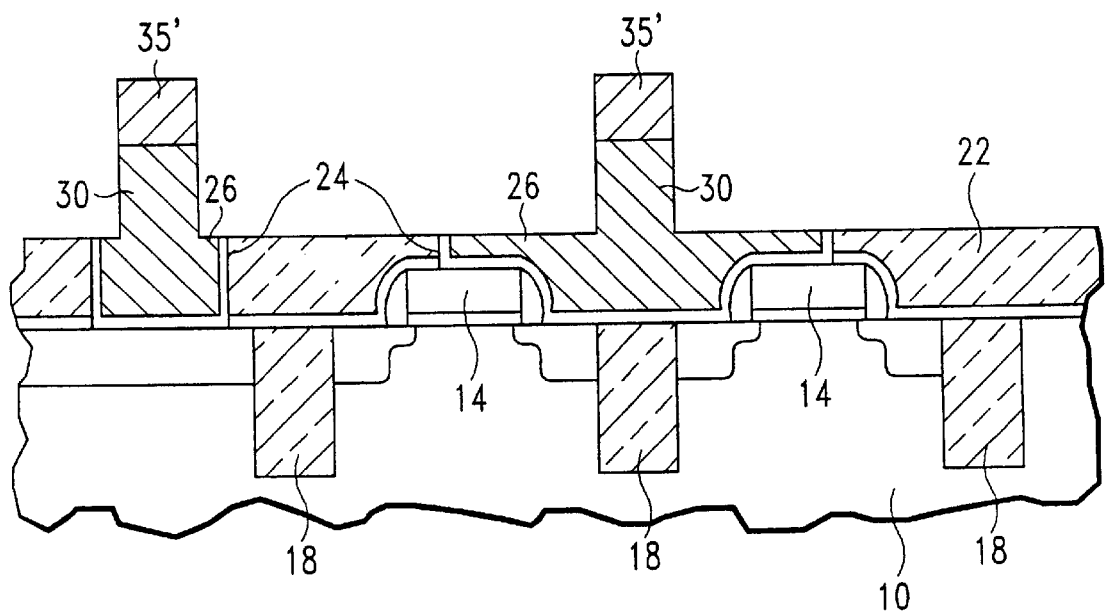

FIGS. 7 and 8 illustrate a second method of forming. this interconnect structure differing from the first mainly in etching back the BPSG layer 22 separately from the tungsten 26. The first steps are identical to those shown and described with respect to FIGS. 1 and 2. As previously described, a substrate having FET devices a first insulator layer is provided. This insulator may be borophosphosilicate glass (BPSG), phosphosilicate glass (PSG), or silicon oxide. After a masking and etching operation is used to etch insulator 22 by a standard selective perfluorocarbon-based RIE, etching the silicon nitride layer by a standard perfluorocarbon-based RIE, depositing titanium nitride, depositing tungsten fill, and CMP to flatten the surface, operations have been performed. While titanium nitride/tungsten is the preferred embodiment, other materials such as aluminum, titanium or polysilicon can be used as the conductive fill.

As shown in FIG. 7, a maskless RIE etch process is performed to etch back the BPSG only. The etch chemistry may consist of a mixture of one or more of fluorinated hydrocarbon, argon, oxygen, and nitrogen. An alternative etchant would be an hydrofluoric acid based aqueous chemistry. As shown in FIG. 8, a photo mask 35 is formed on top of the tungsten areas where the upper portion of the interconnect is to be formed. This may be a simple resist or, a hardmask. Then the tungsten 26 is RIE etched back, as described above, leaving pillars 30 of tungsten which constitute the "stud contact (CA)" portion of the combined local interconnect/stud contact (MC/CA) interconnect. At this point the steps illustrated in FIGS. 5A and 5B or 6A and 6B are performed to complete the process.

FIGS. 9 through 12 illustrate a third method of forming this interconnect structures differing from the first mainly in that very little or no planarization or CMP of the tungsten is required following the deposition step.

Figure 9:
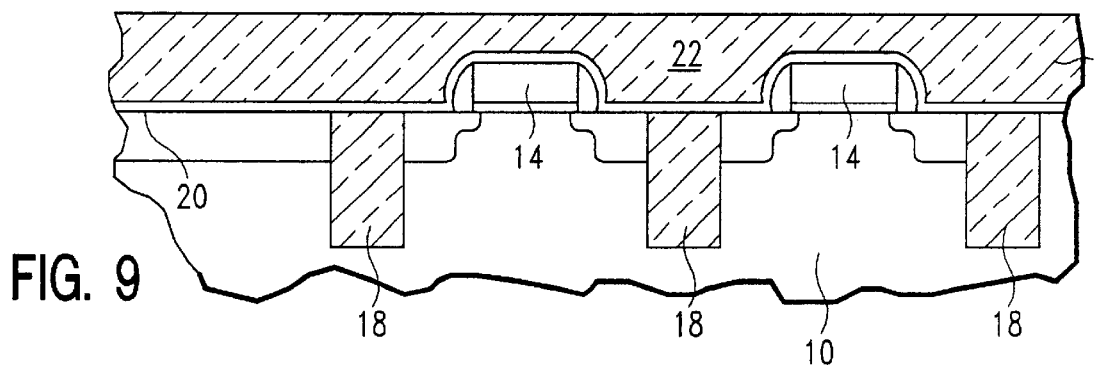
FIGS. 9 through 12 are cross-sectional views of a third embodiment of the invention.

As shown in FIG. 9 a substrate 10 having FET devices, as in FIG. 1, passivated by a first insulator 22 layer is provided. This insulator may be borophosphosilicate glass (BPSG), phosphosilicate glass (PSG), or silicon oxide. In FIG. 8, after a masking operation, the operations of etching the insulator (standard RIE process using fluorine-based chemistry), etching the silicon nitride 20 layer, depositing titanium nitride layer 24, depositing tungsten fill 26, and chemical mechanical polishing (CMP) to flatten the surface, have been performed.

Figure 10:
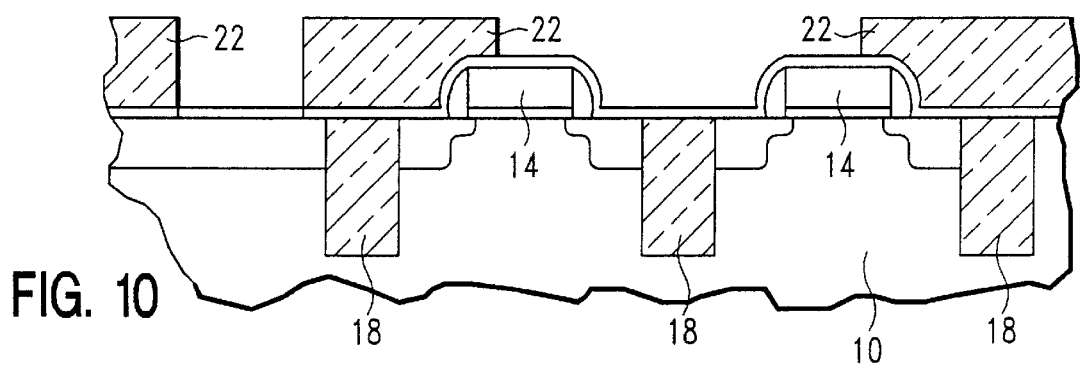
Figure 11:
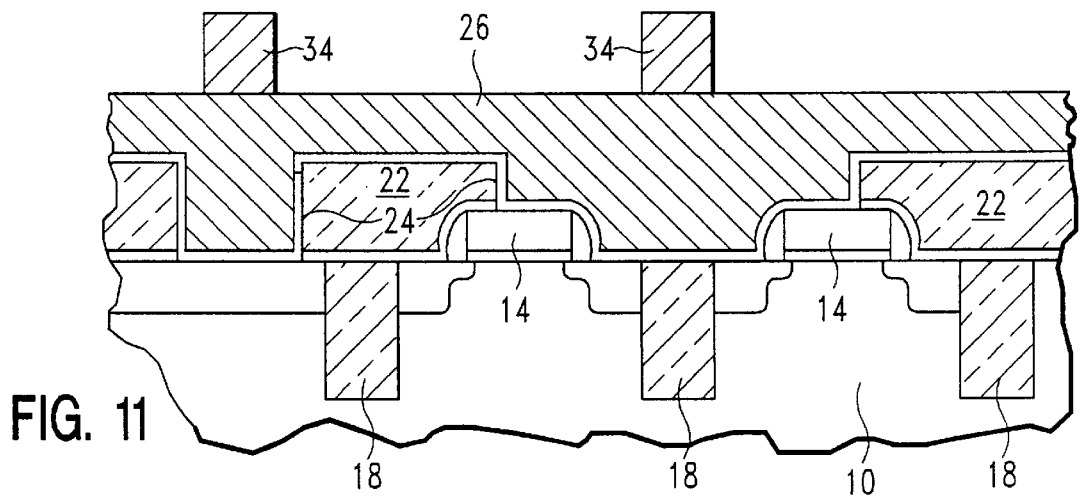
Figure 12:
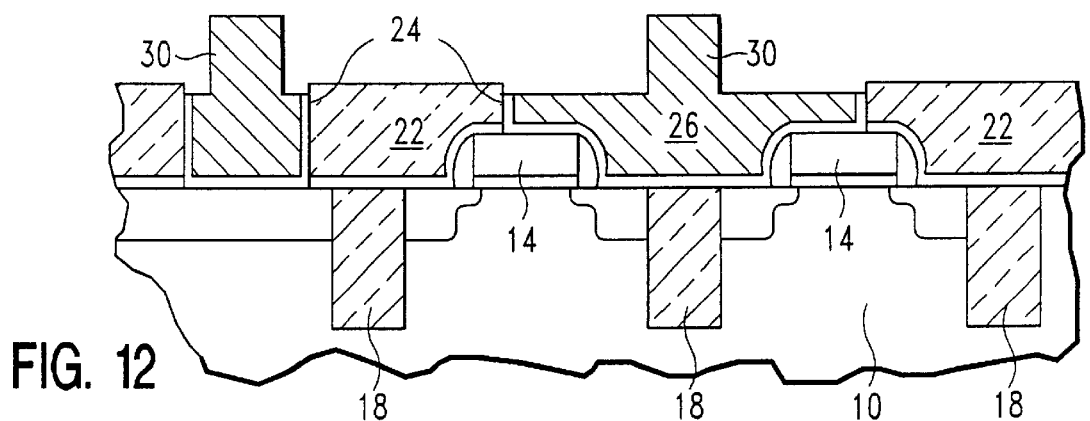

While titanium nitride/tungsten are the preferred materials for the local interconnect/stud contacts, other materials such as aluminum, titanium or polysilicon can be used as the conductive fill. In FIG. 10 a RIE etch process is performed to form trenches in the BPSG and silicon nitride. The etch chemistry can be a standard perflurocarbon-based RIE process. An alternative etchant would be an hydrofluoric acid based aqueous chemistry. In FIG. 11 tungsten 26 has been deposited thicker than the depth of the trenches and substantially to the desired height of the upper portion (30) of the combined local interconnect/stud contact (MC/CA) interconnect. An optional tungsten CMP process could be employed to planarize the tungsten surface. A mask 34 has been formed on top of the tungsten areas where the upper portion of the interconnect is to be formed. This may be a simple resist or a hardmask. In FIG. 12 the tungsten has been RIE etched back and cleaned, as described in connection with FIG. 4, leaving pillars 30 of tungsten which constitute the "stud contact (CA)" portion of the combined local interconnect/stud contact (MC/CA) interconnect. At this point the steps illustrated in FIGS. 5A and 5B or 6A and 6B would be performed.

FIGS. 13 through 17 illustrate another embodiment of the invention which uses dual damascene technology to define the lower portion or local interconnect of the combined local interconnect/stud contact. Dual damascene requires the use of two masks to define both a via (vertical) portion and a line (lateral) portion of a conductive line. An advantage of a dual damascene interconnect is that it permits the local interconnect to pass over the gate electrodes of FET devices.

The invention first forms a dual damascene local interconnect (equivalent to a upside down local interconnect (MC)/stud contact (CA) structure) in a thick insulating layer. A top portion of the local interconnect is removed leaving studs where contact to the first wiring level (M1) is desired. Dual damascene requires the use of two masks to define both a via (vertical) portion and a line (lateral) portion of a conductive line.

Figure 13:
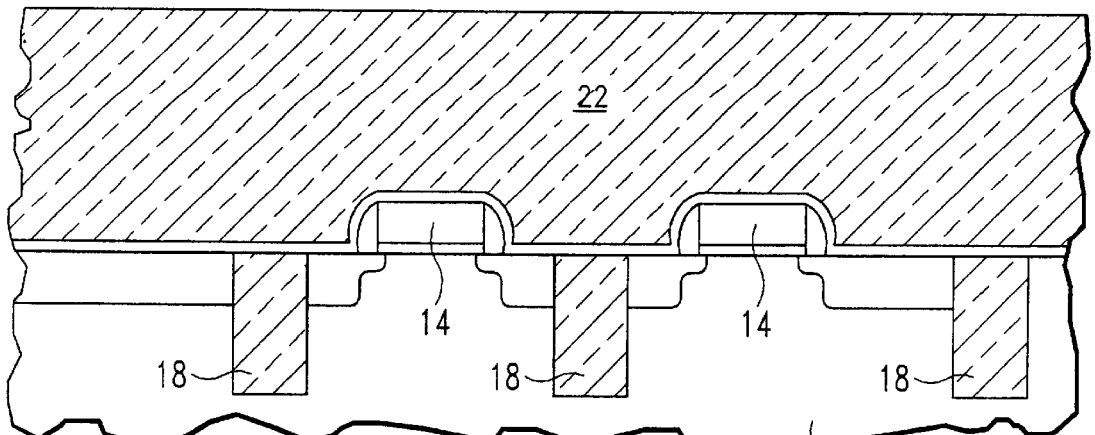
FIGS. 13 through 17 are cross-sectional views of a fourth embodiment of the invention.

Referring now to FIG. 13, as in FIG. 1, a substrate 10 having devices formed therein is the starting point. A first insulating layer 22 has been formed on top of the substrate. This m ay be a layer of high density plasma chemical vapor deposition (HDPCVD) phosositicate glass (PSG) or borophososilicate glass (BPSG), which is followed by an optional CMP process to planarize the wafer surface.

Figure 14:
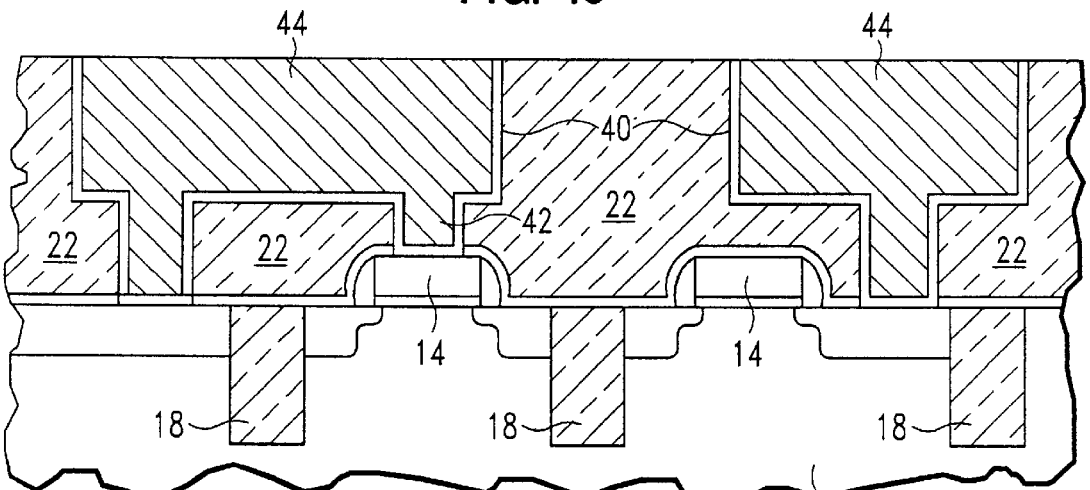

In FIG. 14 a dual damascene local interconnect structure has been etched and filled with a first conductor comprising a liner 40, which may be titanium/titanium nitride, and an inner tungsten core. The core is formed of via portions 42 and line portions 44. Alternatively, other conductors, such as polysilicon could be used.

Figure 15:
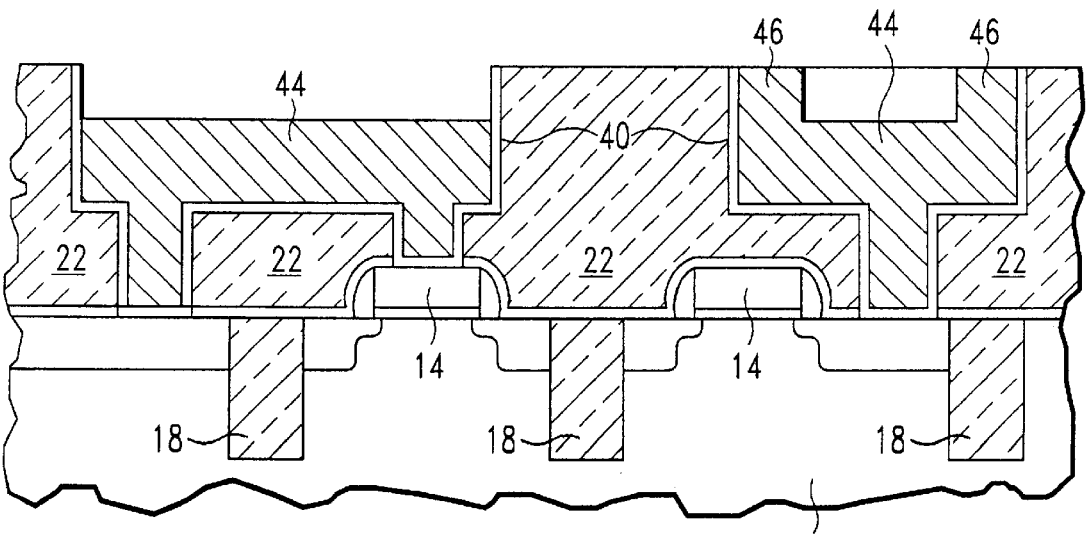

In FIG. 15, the top portion of the local interconnect has been etched back using a reactive ion etch (RIE) process comprising, for example, a sulfur hexafluoride (SF6) chemistry, leaving zero, one or more castellations or upper contact studs 46. An optional cleaning step using, for example, a dilute mixture of sulfuric acid and hydrogen peroxide or a mixture of chromic-phosphoric acid could be employed to clean RIE residuals.

Figure 16:
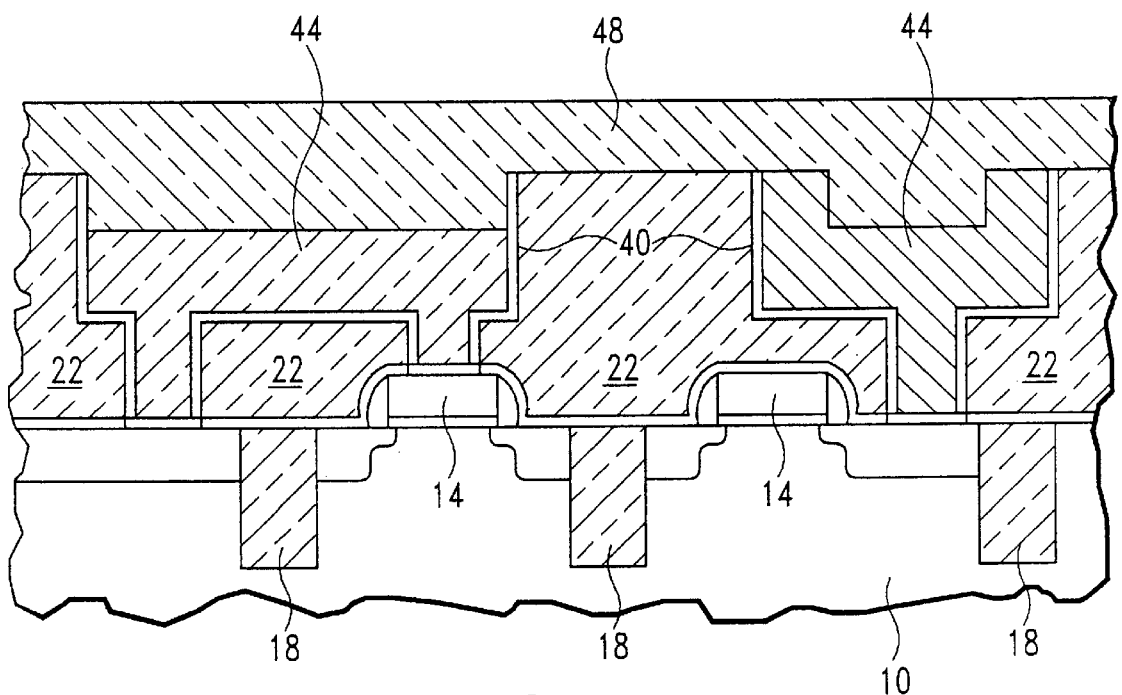
Figure 17:
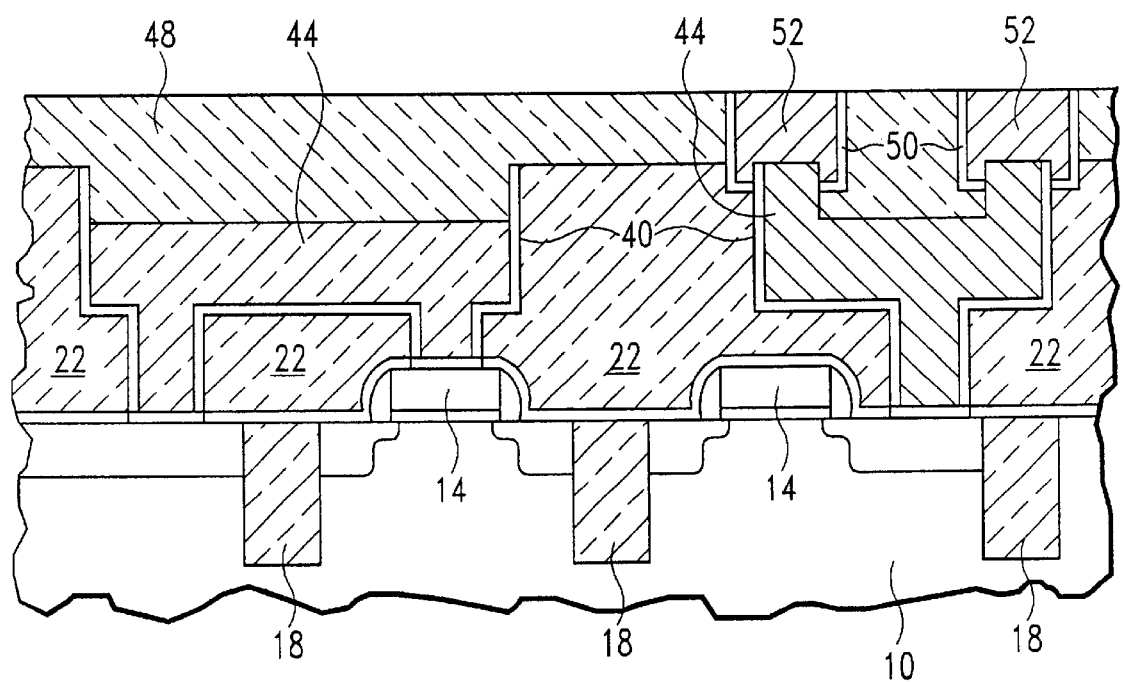

In FIG. 16 a second insulating layer 48 has been deposited and planarized, and in FIG. 17 the first of several wiring levels (normally designated M1, as it is the first of the full levels of interconnect used in the semiconductor process) conductor has been formed by a damascene process. This conductor may comprises an outer tantalum-based liner 50 and a copper core 52, Alternatively, a titanium/titanium nitride liner and aluminum core can be used. A nitride or carbide RIE stop, not shown, as was discussed in FIG. 6B, could be used.

Figure 18:
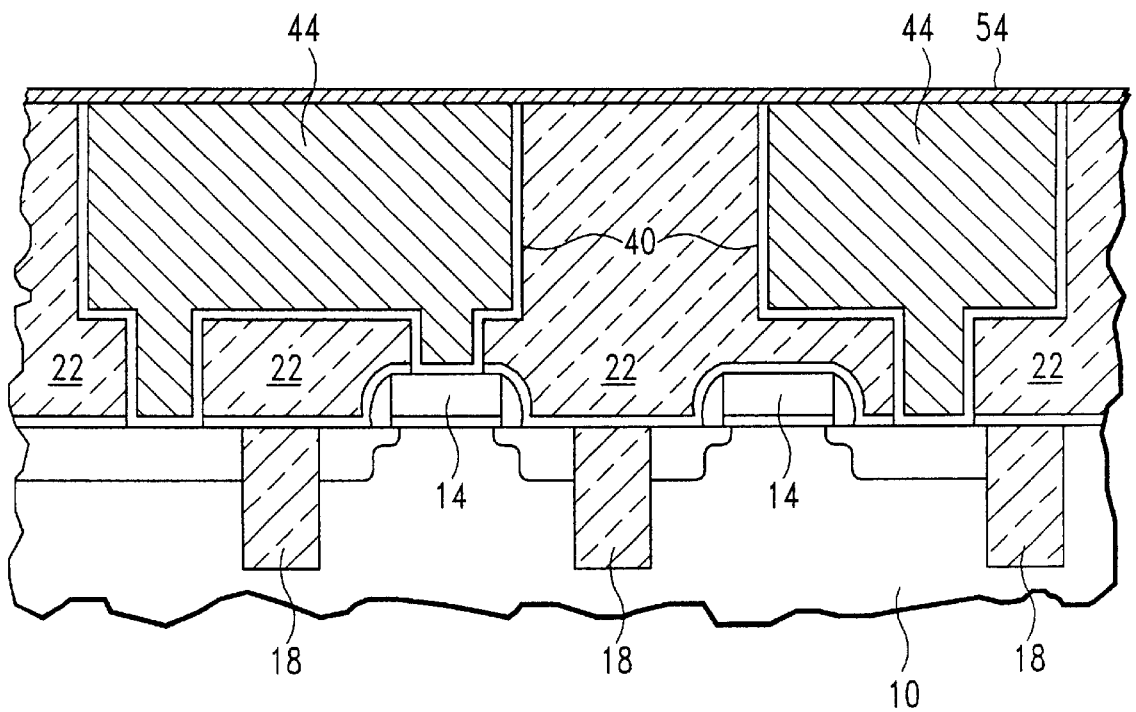
FIGS. 18 and 19 are cross-sectional views of a final embodiment of the invention.
Figure 19:
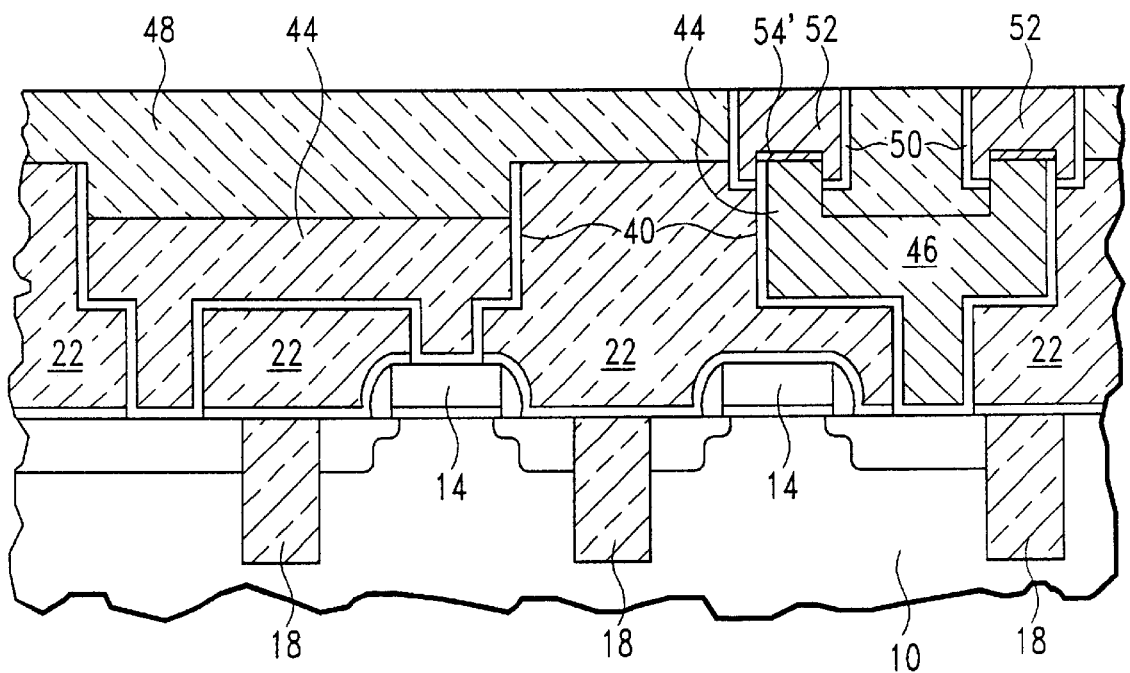

FIGS. 18 and 19 relate to another variation in implementing the invention in which a titanium nitride layer is placed on the interconnect fill 44 following the planarization step represented in FIG. 14 to protect the tungsten from various cleaning processes as shown in FIG. 18. When the stud contacts 46 are formed the titanium nitride layer 54' is left on top. The local interconnect is etched back using a reactive ion etch (RIE) process comprising, for example, a BCl3 etch chemistry followed by, for example, an SF6 chemistry, leaving castellations or upper contact studs 46. The titanium nitride has also been removed except from on top of the studs 54'. The process is completed as in FIGS. 16 and 17 resulting in the structure as shown in FIG. 19.

Thus, the elimination of the problem of yield loss due to the presence of discrete stud contacts by the teaching herein of the use of a single monolithic composite local interconnect/stud via formed of a single material as the result of a single deposition component within a continuous liner.

Those skilled in the art will recognize that variations may be made in the details of the foregoing without departing from the spirit of the invention. For example, virtually any type in integrated device technology can be substituted for the semiconductor devices described.

What is claimed is:

1. An electronic device having contacts between a substrate and an upper level of interconnect metallurgy comprising:
    at least one first monolithic conductive member having a predetermined resistivity and a predetermined height, said first member comprising a first surface in electrical contact with a substrate and a second surface in electrical contact with a conductor formed in said upper level of interconnect metallurgy, said conductor having a substantially lower resistivity than said conductive member; and
    at least one second monolithic conductive member having said predetermined resistivity and said predetermined height, said second member comprising a first surface in electrical contact with a first portion of said substrate, a second surface in electrical contact with a second portion of said substrate and a third surface in electrical contact with a conductor formed in said upper level of interconnect metallurgy.

2. The electronic device of claim 1 wherein said first and second monolithic conductive member comprises a refractory metal.

3. The electronic device of claim 2 wherein said first and second conductive member comprises tungsten.

4. The electronic device of claim 1 wherein said substrate comprises a semiconductor device including active and inactive surface regions.

5. The electronic device of claim 4 wherein said surfaces in contact with said substrate contact active regions comprising diffused regions and FET gate electrodes.

6. The electronic device of claim 1 wherein said conductor formed in said upper level of interconnect metallurgy comprises a copper-based material.

7. The electronic device of claim 1 wherein said monolithic conductive members comprises a dual damascene structure.

8. The method of making an electronic device comprising the steps of:

providing a substrate of which contacts are to be formed;

forming a first insulating layer a substantially planar surface on said substrate;

forming openings in said first insulating layer to expose at least three areas of said substrate to which electrical contacts are to be formed;

forming a first conductor within said openings such that the openings are filled and the surface of said first conductor is substantially planar and at least two of said areas of said substrate to which contacts are formed are electrically connected by said first conductor;

forming a mask on the surface of said first conductor where stud contacts are desired, leaving the remainder of said first conductor exposed;

removing the thickness of said first conductor in exposed areas leaving raised stud contacts where said first conductor is not exposed; and forming a level of interconnect comprising a second insulator and a second conductor over said substrate such that said second conductor is contacting said raised stud contacts.

* * * * *